(12) United States Patent
Belford

(10) Patent No.: US 6,455,397 B1
(45) Date of Patent: Sep. 24, 2002

(54) METHOD OF PRODUCING STRAINED MICROELECTRONIC AND/OR OPTICAL INTEGRATED AND DISCRETE DEVICES

(76) Inventor: Rona E. Belford, 3 Stonegate Dr., Hilton Head Island, SC (US) 29926

(*) Notice: Subject to any disclaimer, the term of this patent is extended or adjusted under 35 U.S.C. 154(b) by 5 days.

(21) Appl. No.: 09/710,127

(22) Filed: Nov. 9, 2000

Related U.S. Application Data

(60) Provisional application No. 60/165,708, filed on Nov. 16, 1999.

(51) Int. Cl.[7] ............................ H01L 21/30; H01L 21/46
(52) U.S. Cl. ............................ 438/457; 438/50; 438/29; 438/938; 438/973
(58) Field of Search ................................. 438/285, 590, 438/457, 938, 29, 46, 50, 973

(56) References Cited

U.S. PATENT DOCUMENTS

| | | | | |
|---|---|---|---|---|
| RE29,009 E | * | 10/1976 | Jeffers | 73/88.5 |
| 4,089,927 A | * | 5/1978 | Taylor | 310/331 |
| 5,256,550 A | | 10/1993 | Laderman et al. | 437/106 |
| 5,395,788 A | * | 3/1995 | Abe et al. | 437/61 |
| 5,787,104 A | * | 7/1998 | Kamiyama et al. | 372/43 |
| 6,023,082 A | * | 2/2000 | McKee et al. | 257/295 |
| 6,025,251 A | * | 2/2000 | Jakowetz et al. | 438/464 |

FOREIGN PATENT DOCUMENTS

| | | | |
|---|---|---|---|
| DE | 19639407 A1 | * | 3/1998 |
| JP | 05-275300 | * | 10/1993 |

OTHER PUBLICATIONS

Dr. Rona E. Belford, *Mechanically Strained, High Mobility, Strained–Si Devices*, Mar. 24, 1998, The Small Business Innovation Research Program Website at www.winbmdo.com '98 SBIR PhaseI . . . Topic 14—Electronic Materials.

Maiti, C.K.; Bera, L.K. Chattopadhyay, S. *Strained–Si Heterostructure Field Effect Transistors*, Department of Electronics and ECE, IIT, Kharagpur 721302, India, Received Mar. 9, 1998, accepted for publication Jul. 14, 1998.

Welser, Jeffrey J.; Strained–Si MOS Field–Effect Transistors: Building Devices On Relaxed–Si 1–xGE xBuffer Layers, Stanford University, Solid State Electronics Lab., Stanford, California 94305–4055.

* cited by examiner

*Primary Examiner*—Carl Whitehead, Jr.
*Assistant Examiner*—Khanh B. Duong
(74) *Attorney, Agent, or Firm*—Howard & Howard

(57) ABSTRACT

A method of producing a strained crystalline semiconductor microelectronic device(s). Microelectronic device(s) are formed within a membrane. The method includes the steps of straining a membrane along at least one axis and bonding the membrane to a base substrate.

30 Claims, 4 Drawing Sheets

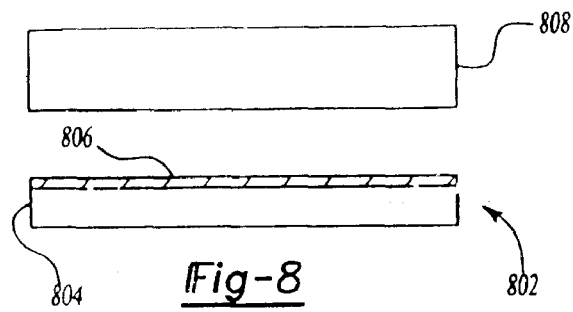
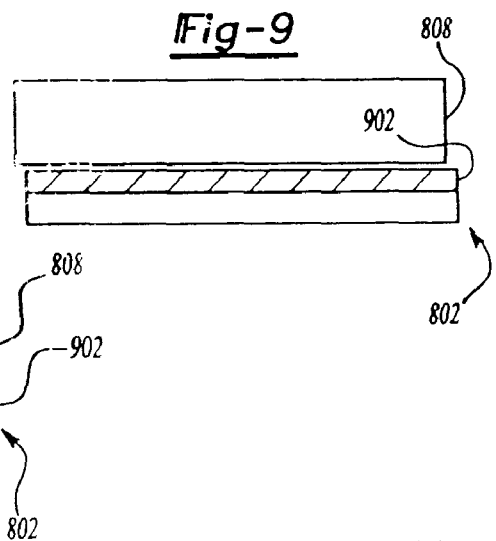
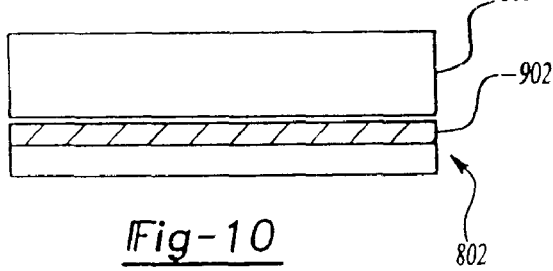
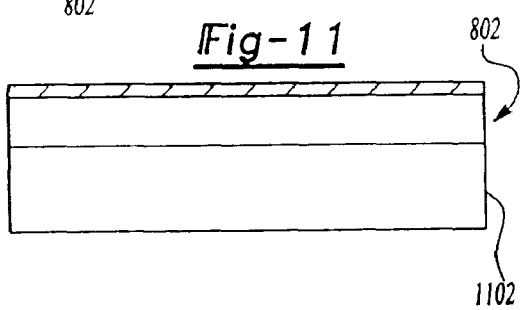
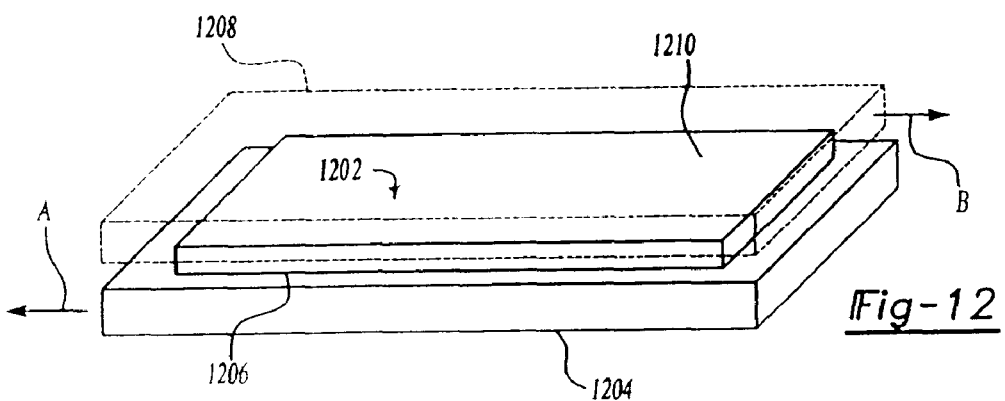

METHOD OF PRODUCING STRAINED MICROELECTRONIC AND/OR OPTICAL INTEGRATED AND DISCRETE DEVICES

This application claims the benefit of U.S. Provisional Application No. 60/165,708, filed Nov. 16, 1999.

BACKGROUND OF THE INVENTION

1. Technical Field

This invention generally relates to microelectronics, and more particularly, to a method of producing strained crystalline semiconductor-based microelectronic and/or optical integrated and discrete devices.

2. Background of the Invention

Crystalline semiconductors have proven to be increasingly useful. Types of crystalline semiconductor-based microelectronic devices are given here to include integrated circuits and discrete devices of all types including; uni-polar transistors, bi-polar transistors, radiation emitting devices, photo-sensitive devices, lasers, photonic devices and the crystalline semiconductor material itself.

Integrated circuits, for example, are produced on silicon (Si) wafers. It has been found that introducing strain into the integrated circuit has beneficial properties, e.g., increased conductance. This is increasingly important as the limits of the semiconductor material and current fabricating processes are reached.

At present all high performance tensile strained-silicon devices are strained bi-axially via expensive, highly technical heterostructure fabrication. Strain is introduced in a silicon layer by incorporating atoms of larger atomic volume into the silicon lattice, such as germanium (Ge), then epitaxially growing a strained-silicon layer on top. The Ge/Si layers must be relaxed before the Si is pseudomorphically deposited. The deposited silicon layer is bi-axially strained as a result of lattice mismatch. The entire process is expensive as strain is induced prior to processing and subsequent device fabrication is entirely non-standard. This research is device-level research only.

With regard to integrated circuit fabrication, metal oxide semiconductor field effect transistors (MOSFETs) form the basis of complementary metal oxide semiconductor (CMOS) circuits, which are by far the most common integrated circuits. As integrated circuits, such as microprocessors, evolve, faster operating performance is required. It is preferable, for speed and power considerations, for the chip to be as small as possible, decreasing dimensions is termed scaling. As CMOS dimensions decrease to deep submicron channel lengths (<0.2 microns), subtle short channel effects such as source/drain parasitic resistances and velocity saturation of carriers in the channel, become more significant. Other types of devices also benefit from the introduction of strain within the semiconductor device, e.g., bipolar transistors.

The present invention is aimed at one or more of the problems identified above.

SUMMARY OF THE INVENTION

In a first aspect of the present invention, a method of producing a strained crystalline semiconductor microelectronic device is provided. The microelectronic device is formed within a membrane. The method includes the steps of straining a membrane along at least one axis and bonding the membrane to a base substrate.

In a second aspect of the present invention, a method for producing a strained crystalline microelectronic device is provided. The method includes the steps of producing a microelectronic device in the form of a membrane, straining the membrane along at least one axis, and bonding the membrane to a base substrate.

In a third aspect of the present invention, a method of producing strained crystalline microelectronic devices is provided. A plurality of crystalline microelectronic devices is integrally formed in a membrane. The method includes the steps of producing the membrane, straining the membrane along at least one axis, mounting and bonding the membrane on a base substrate, and dicing the membrane to separate the strained crystalline microelectronic devices.

In a fourth aspect of the present invention, a method of producing a strained crystalline microelectronic device is provided. A microelectronic device is formed in a membrane. The method includes the steps of bonding a base substrate to a first side of the membrane, bonding an upper substrate to a second side of the membrane, and applying sheer strain to the membrane by applying force to the base and upper substrate.

BRIEF DESCRIPTION OF THE DRAWINGS

FIGS. 8–11, are diagrammatic illustrations of a membrane during a thermal process to apply stress thereto, according to an embodiment of the present invention; and, FIG. 12 is a diagrammatic illustration of sheer stress being applied to a membrane, according to an embodiment of the present invention.

DETAILED DESCRIPTION OF THE PREFERRED EMBODIMENT

Figure 1A:
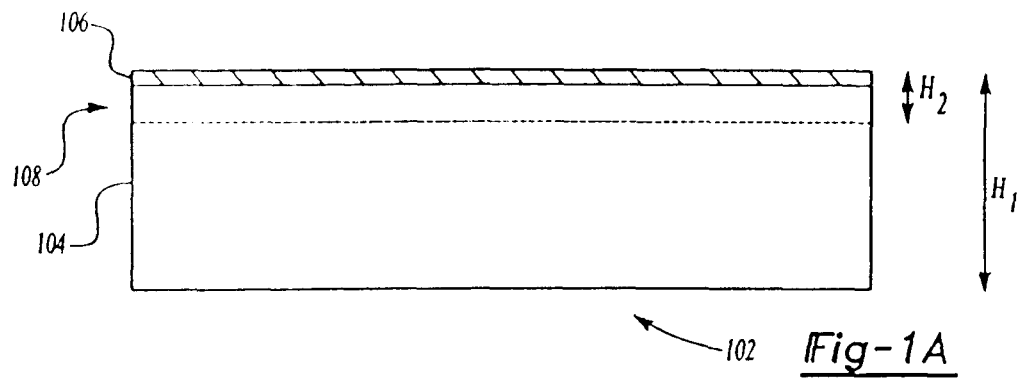
FIG. 1A is a side view of a crystalline microelectronic device.

With reference to the drawings and in operation, the present invention provides a method of producing an in-plane tensile-strained crystalline semiconductor microelectronic device. The method is suitable for any type of microelectronic device as afore mentioned; including integrated circuits and discrete devices of all types including; uni-polar transistors, bi-polar transistors, radiation emitting devices, photo-sensitive devices, lasers, photonic devices and the semiconductor material itself. With reference to FIG. 1, any microelectronic device 102 fabricated using any means may be used. Preferably, the microelectronic device 102 includes a silicon wafer 104.

Generally, the process of the present invention introduces strain to the microelectronic device 102 after fabrication, i.e., after the electronics have been formed on the silicon wafer 104. The applied stress strains and/or stretches the microelectronic device 102 along at least one axis, as described below.

It should be noted that, generally, one or more microelectronic devices 106 are fabricated on a single wafer 104. After fabrication the wafer 104 is diced or cut to separate the devices 106 into individual chips or dies. The following methods may be applied to either an individual die or wafer 104 with microelectronic devices 106 formed therein. For purposes of explanation only, the following discussion will be in terms of an individual die containing a single microelectronic device. However, the methods are equally applicable on the wafer scale.

Prior to the microelectronic device 102 being placed under strain, the silicon wafer 104 must have a predetermined thickness, i.e., atomic scale up to 100 microns depending on the application and the amount of strain desired.

With reference to FIG. 1, preferably the silicon wafer 104 has an initial thickness of $H_1$, generally about 650 microns for a six (6) inch wafer. The silicon wafer 104 must be reduced in thickness to reach a desired thickness of $H_2$, shown in dotted line. The reduced-in-thickness silicon wafer 104 and the integrated device or devices 106 is referred to as a membrane 108. Reducing the thickness of the wafer 104 may be accomplished by any suitable means, e.g., chemical-mechanical polishing (CMP), grinding, lapping, polishing, and/or etching.

Figure 1B:
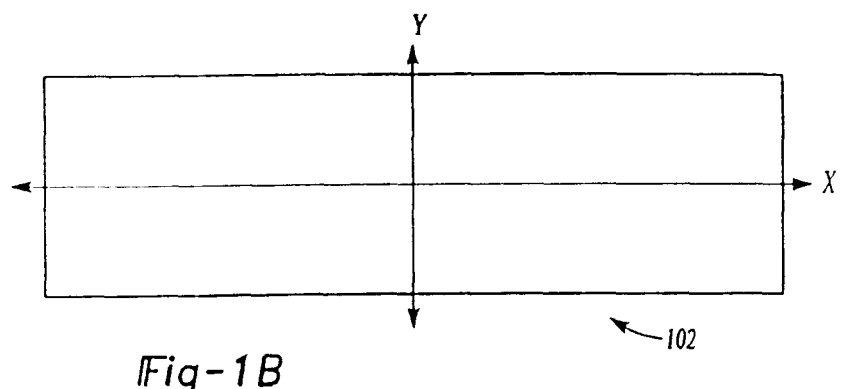
FIG. 1B is a top view of the microelectronic device of FIG. 1A.

The membrane 108 is then strained (in-plane) uni-axially along either a first axis or a second axis Y or bi-axially along both the first axis X and the second axis Y (see FIG. 1B). With reference to FIGS. 2–6, several methods for mechanically straining the membrane 108 uni-axially are illustrated.

Figure 2:
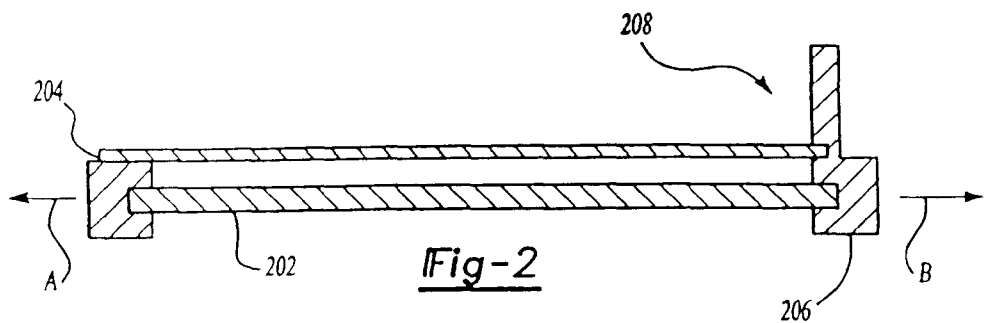
FIG. 2 is a diagrammatic illustration of stress and/or strain being mechanically applied to a membrane, according to an embodiment of the present invention.

With specific reference to FIG. 2, in one embodiment of the present invention a membrane 202 is mechanically stretched or strained uni-axially using first and second clamps 204, 206 adhered to the membrane 202. A screw and micrometer assembly 208 applies force to the first and second clamps 204, 206 in the direction of arrows A and B. The forces applied to the first and second clamps 204, 206 are set to produce predetermined strain within the membrane 202.

Figure 3:
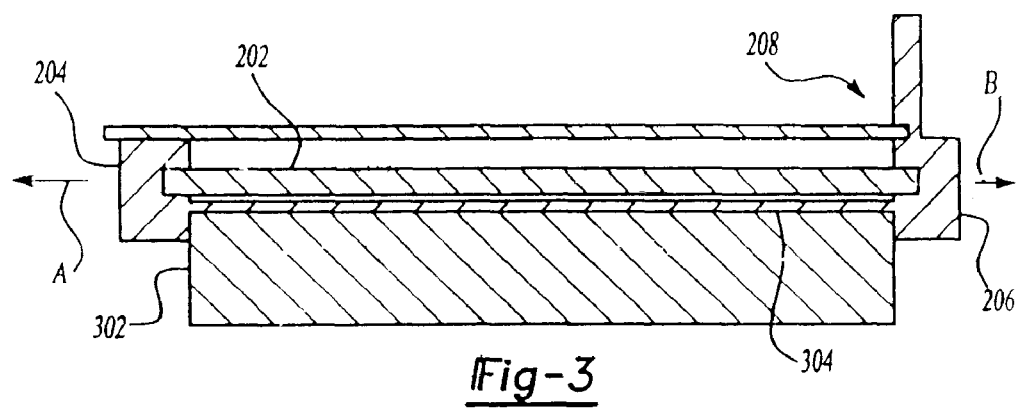
FIG. 3 is a diagrammatic illustration of a base substrate being bonded to the strained membrane of FIG. 2, according to an embodiment of the present invention.

With specific reference to FIG. 3, while the membrane 202 is under tension, a base substrate 302 is bonded to the membrane 202, preferably using a layer of adhesive 304. After the adhesive 304 has cured, the first and second clamps 204, 206 are released and the membrane 202 maintains its enlarged length. The base substrate 302 may be composed from a number of rigid materials, such as a crystalline semiconducting material (e.g., silicon), an amorphous material (e.g., glass or ceramic), a polymer material (e.g., polyimides or mylar), a poly-crystalline material, an organic material (e.g., imides), or a composite with two or more of the above.

Figure 4:
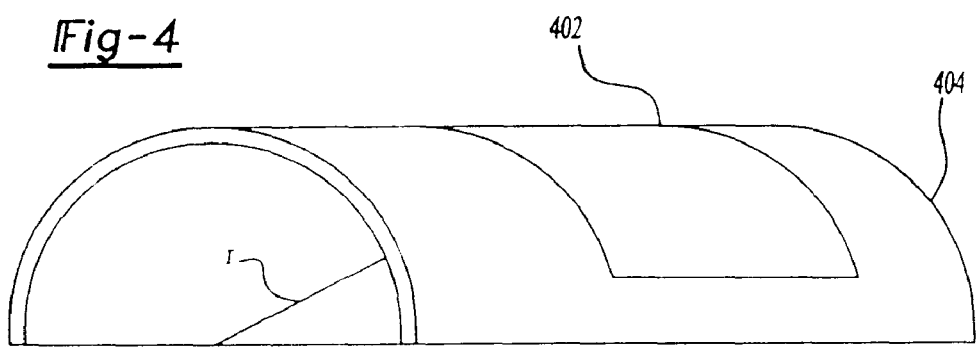
FIG. 4 is a diagrammatic illustration of stress and/ or strain being mechanically applied to a membrane where $H_2$ is preferably greater than 10 microns, according to an other embodiment of the present invention.

With specific reference to FIG. 4, in another embodiment of the present invention a membrane 402 is uni-axially strained by mounting and bonding to a curved base substrate 404. The curved base substrate 404 has a defined radius, r. Preferably, the membrane has a thickness of not less than 10 microns. Generally, the shape and size of the mounting structure 404 are designed for a specific strain value. For example, a square die having a side length of 2.54 mm and thickness of 40 microns, mounted and bonded on a curved base substrate with a radius of 60 mm has only a 0.34 mm deviation in height. This embodiment is applicable, as are all the methods described in the application, on a wafer scale as well as the die scale.

Figure 5:
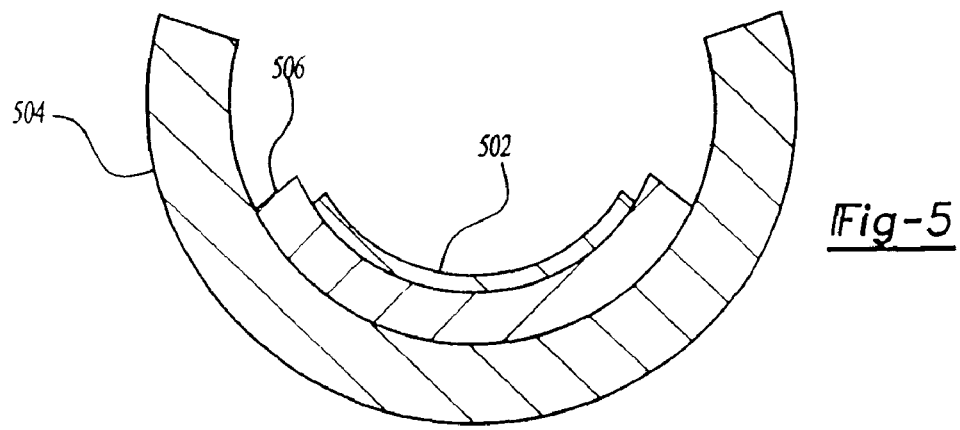
FIG. 5 is a diagrammatic illustration of stress and/or strain being mechanically applied to a membrane, according to still another embodiment of the present invention.

With specific reference to FIG. 5, in another embodiment of the present invention a thin crystalline semiconductor sheet 506 is first positioned within the curvature of a support structure 504. Preferably, the support structure 504 is composed from any rigid material, e.g., glass. While the semiconductor sheet 506 is within the support structure 504, the membrane 502 is bonded to the thin crystalline semiconductor sheet 506. Preferably, the semiconductor sheet 506 has a thickness of greater than 20 microns and the membrane 502 has a thickness of less than 10 microns. After the membrane 502 and the semiconductor sheet 506 have been bonded together, they are released from the curved support and the semiconductor sheet is further bonded to a base substrate (not shown).

Figure 6:
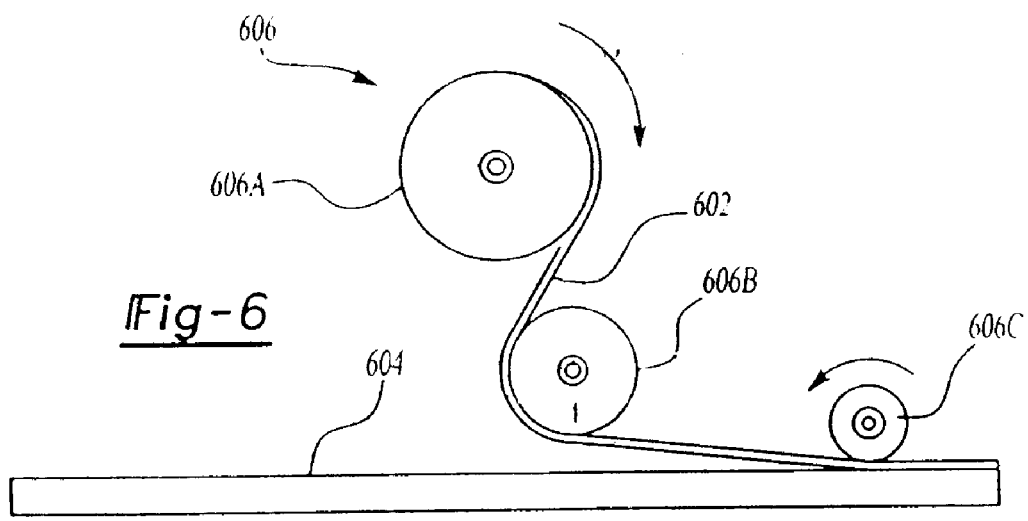
FIG. 6 is a diagrammatic illustration of stress being mechanically applied to a membrane, according to even still another embodiment of the present invention.

With specific reference to FIG. 6, in still another embodiment of the present invention a membrane 602 is strained through a series of rollers 606 prior to being bonded to a base substrate 604. Preferably, the series of rollers 606 includes first and second support rollers 606A, 606B and a weighted roller 606C. The rollers 606A, 606B, 606C are set at a predetermined tension to produce uniform strain within the membrane 602.

With regard to FIGS. 7–11, several methods for mechanically straining the membrane 108 bi-axially are illustrated.

Figure 7:
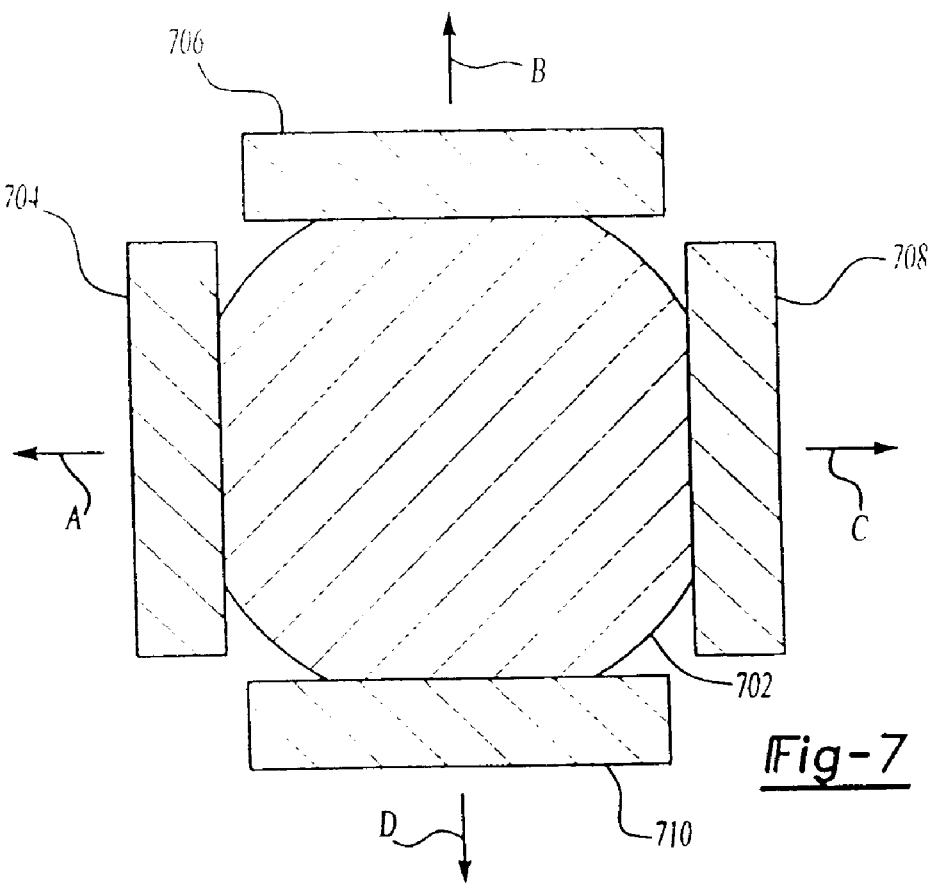
FIG. 7 is a diagrammatic illustration of stress being mechanically, bi-axially applied to a membrane, according to an embodiment of the present invention.

With specific reference to FIG. 7, in one embodiment of the present invention a membrane 702 is mechanically stretched or strained bi-axially using third, fourth, fifth and sixth clamps 704, 706, 708, 710 adhered to the membrane 702. A pair of screw and micrometer assemblies (not shown) apply force to the third, fourth, fifth and sixth clamps 704, 706, 708, 710 in the direction of arrows A, B, C, and D, respectively. The forces applied to the third, fourth, fifth and sixth clamps 704, 706, 708, 710 are set to produce predetermined strain within the membrane 702.

With specific reference to FIGS. 8–11, a membrane 802 is mechanically strained bi-axially using differential thermal properties. The membrane 802 is bonded to a temporary support 808 at a low temperature (see FIG. 9) with a layer of temporary adhesive 902. The temporary support 808 is composed of a suitable material with a higher thermal coefficient of expansion than the membrane 802. The low temperature is predetermined as a function of the thermal coefficient of expansion of the temporary support 808.

With reference to FIG. 10, the bonded temporary support 804 and the membrane 802 are then heated (or allowed to rise to ambient) so that the microelectronic device is under bi-axial tensile strain. With reference to FIG. 11, a base substrate 1102, of similar thermal coefficient of expansion to the membrane 802, is bonded to the membrane 802 and the temporary support 808 has been removed.

Alternatively, the temporary substrate 808 may be composed of a suitable material with a smaller thermal coefficient of expansion which is bonded to the microelectronic device 802 at an elevated temperature and then allowed to cool.

With reference to FIG. 12, sheer strain and or stress is applied to a membrane 1202. A base substrate 1204 is bonded to a bottom surface 1206 of the membrane 1202. An upper support 1208 is bonded to a top surface 1210 of the membrane 1202. Force is applied to the base substrate 1204 and the top support in directions of arrows A and B, respectively, to apply sheer strain to the membrane 1202. Alternatively sheer stress can be applied by rotating the upper structure 1208 in the opposite direction to the lower base substrate 1204 about some arbitrary pivot point.

INDUSTRIAL APPLICABILITY

Using standard fabrication techniques, crystalline semiconductor microelectronic devices, e.g., integrated circuits and discrete devices of all types including; uni-polar transistors, bi-polar transistors, radiation emitting devices, photo-sensitive devices, lasers, and photonic devices are first produced on silicon (Si) wafers 102.

For the purposes of discussion only, the following will be in terms of a Si integrated circuit 102. The integrated circuit 102 is subsequently thinned to less than 150 microns (typically, 0.2 to 80 microns). These single-crystal-Si membranes 108 are flexible and can be mechanically strained in a number of different ways (see above). Tensile straining along a single axis yields in-plane uni-axial-tensile-strained-Si integrated circuits. Tensile straining along two axes yields in-plane bi-axial-tensile-strained-Si integrated circuits. Sheer straining can shift the maxima and minima in the k-p (or E(k) curve) continuum. Strain can be introduced via a number of ways. Introducing strain results in economically desirable enhancements of the electronic and optical properties of the semiconductor and of devices and/or integrated circuits, which have been fabricated therein.

As discussed above, currently all high performance tensile strained-Si devices are produced on strained-Si which has been strained bi-axially and is produced via expensive, highly technical heterostructure fabrication. These structures are at the device-level only and are still in the research stage.

By contrast mechanically inducing strain, after IC fabrication, circumvents all the inherent problems in making strained-Si, i.e. the entire heterostructure fabrication is circumvented. Mechanically straining the lattice after IC processing offers the possibility of obtaining a range of high-speed devices, integrated circuits and entire systems in strained-Si. Applications of this invention are the production of inexpensive, high-speed, strained-Si devices, integrated circuits and systems. Strained silicon is a superior semiconductor compared to bulk Si.

Once under permanent tensile strain, enhanced electronic properties of: lower band gap, increased mobility/conductivity give rise to enhanced electrical and optical properties of the strained integrated circuit. Device speed is increased and power consumption may be reduced through this process without further scaling.

In the case of uni-axial applied strain, the increase in mobility is directional and is due to a decrease in in-plane effective mass. This increase in mobility is observed and in restricted geometries, this is marked when at right angles to the direction of applied strain.

The level of strain can be controlled directly varying the induced percentage strain prior to bonding. In the case of cylindrical supports, strain is varied by varying the radius of curvature or by varying membrane thickness. The range of strain is kept outside of that associated with dislocation formation. Most membranes can be strained elastically without experiencing deformation or fracture. Plastic deformation has not been evident at the chosen levels of strain.

Uni-axial strained silicon has a number of advantages over bi-axially strained Si for metal oxide semiconductor (MOS) technology. Bi-axially strained Si may have greater application in bipolar technology. The present invention facilitates high performance n- and p-MOSFETs and bipolar devices to be within the capability of standard production IC foundries. It also facilitates the inexpensive production of high performance CMOS circuitry, ICs and entire integrated systems. Mechanically straining membranes containing ICs is especially applicable to Silicon On Insulator (SOI) technology.

The present invention also has applicability in optical devices as straining Si decreases the band gap. This could have future application in chip to chip optical interconnects. Also sheer straining along a single axis of an indirect semiconductor will shift the maxima and minima in the k-p (or E(k) curve) continuum and produce a variety of different optical properties depending on the level of strain used. Severe strain could lead to a more direct semiconductor being formed from an indirect semiconductor and hence give an opportunity to create lasers within indirect semiconductors such as silicon and germanium.

Improvements in the mobility of both n-type and p-type silicon, strained using the method described here, are in the order of an improvement factor of 1.9 for an applied strain of 0.04%. This compares most favorably to heterostructure-bi-axially-strained Si where an improvement factor 1.6 requires at least ten times as much strain (0.4% strain). The extent of our applied strain is easily controlled. The impact of this invention's improvement in the basic properties of semiconductors directly affects present day Si technology: it will improve the operating characteristics of existing submicron MOSFETs substantially and will extend the ultimate limit of IC miniaturization by the equivalent of about two generations in the history of microelectronics.

There are many advantages associated with this method of straining crystalline semiconductors. The main points are listed below grouped under salient headings.

Strain Considerations

The method described here can be used in various formats to apply tensile uni-axial strain; tensile bi-axial strain; and, sheer strain. Prior to fixing, the degree of strain can be varied and controlled with high precision.

Material Considerations and the Sub-Micron Regime

Enhancing the mobility and or conductivity of silicon has several advantages especially in submicron regime. As dimensions decrease to submicron channel lengths, especially below 0.2 microns, subtle short channel effects such as source/drain parasitic resistances, velocity saturation of carriers in the channel, photon scattering and contact resistances, gain significance. These effects are positively affected by an increased mobility and or conductivity. The mechanically strained-Si can also be more evenly strained than epitaxially grown strained-Si. High mobility requires good quality material.

Superiority Over the Current State of the Art

The current art of producing faster, enhanced performance ICs is scaling. Scaling is extraordinarily expensive as all aspects of IC manufacture are affected and require change. The ability to scale mainstream electronics below 0.1-micron technology is under question as material and operational device mechanisms reach limiting values. Further scaling becomes uneconomic. Gaining alternatives to scaling has spurred research into strained silicon devices, but this is still at a research level where; enhanced electron and hole mobility is achieved by introducing strain into the Si lattice prior to device fabrication. At present this is done by incorporating atoms of larger atomic volume into the Si lattice, such as Ge. Subsequent pseudomorphic growth of a strained-Si layer tends to produce thread dislocations. Misfit dislocations are appreciable if the silicon layer is slightly thicker than the critical thickness. All drawbacks in this production method are related to Ge being incorporated into the Si lattice; defect formation, oxide and nitride problems in the fabrication processes, and a very restricted geometry are the major problems.

The advantages of mechanically straining the lattice after IC fabrication processing opens up the possibility of enhancing a wide range of strained-Si devices, both unipolar and bipolar, which are difficult to fabricate within the geometric confines of heterostructure epitaxial device design. It also opens up the possibility of enhancing entire integrated systems. Our invention by passes the present art's problems by introducing the strain after IC processing, macroscopically, by mechanically straining the entire wafer or chip. This method maintains all standard manufacturing knowledge and techniques augmenting the technology with the relatively simple "membrane processing" described above. A range of different strains can be attained simply. These devices can be made without the difficulty and expensive processing of heterostructure formation. Moreover the scope of our invention is far greater than for previous methods encompassing both uni-axial and bi-axial strain and application extends to both unipolar to bipolar electronic devices, circuits and systems.

Advantages of Uni-Axial Strain Over Bi-Axial Strain

Uni-axial strain has significant advantages. When Si is strained along a single axis the lower conduction band level has twice the relative population in comparison to the biaxially strained material. This increases the conductivity. Enhanced device performance in uni-axial strained-Si is apparent at lower strain levels than is observed in the biaxially strained case. The lower the required strain the less the host is prone to defects and the more reliable the product. The devices need to be aligned at the layout stage to take full advantage of uni-axial strain. The carrier transport direction is best at right angles to the direction of applied strain. Our method is the first to enable uniaxial in-plane strain for wafer scale application.

Optical Benefits

Straining crystalline semiconductors increases the mobility by lowering the inplane effective mass. Increasing the inter-atomic distance even by very small amounts affects the electronic energy levels. The band gap is altered and thus optical properties are altered. This is termed "bandgap engineering". One unique attribute of our method is that the extent of applied strain can be easily and accurately varied. Thus the band gap can be accurately engineered to obtain a range of band gap energies and thus a range of photon energies with which it can react. A new spectrum of electromagnetic energy interactions is possible not only from Si but from other semiconductors.

There is an opportunity to make optical devices within both uni- and bi-axially strained-Si, which are not otherwise possible. If strained dies are mounted and bonded on to transparent supports access to devices could be made optically from remote sites giving the possibility of 3-D interconnection. Also at the membrane thickness we are using not only IR radiation but optical range possibilities exist.

What is claimed is:

1. A method of producing a strained crystalline semiconductor microelectronic device, including the steps of:
    applying a tensile strain to a membrane along at least one axis, the microelectronic device being formed within the membrane; and
    bonding the membrane to a base substrate.

2. A method, as set forth in claim 1, wherein a plurality of microelectronic devices are formed within the membrane.

3. A method, as set forth in claim 1, wherein the step of straining the membrane along at least one axis includes the step of mechanically straining the membrane in-plane.

4. A method, as set forth in claim 1, wherein the step of straining the membrane along at least one axis includes the step of mechanically straining the membrane uni-axially.

5. A method, as set forth in claim 1, wherein the step of straining the membrane along at least one axis includes the step of mechanically straining the membrane bi-axially.

6. A method, as set forth in claim 1, including the following steps before the step of bonding the membrane to a base substrate:
    bonding the membrane to a temporary support at a low temperature, the temporary support having a higher thermal expansion coefficient than the membrane, and
    raising the temperature of the membrane and temporary support; and removing the temporary support after the step of bonding the membrane to a base substrate, the base substrate having a thermal expansion coefficient similar to that of the membrane.

7. A method, as set forth in claim 1, including the following steps before the step of bonding the membrane to a base substrate:
    bonding the membrane to a temporary support at a first temperature, the temporary support having a lower thermal expansion coefficient than the membrane;
    lowering the temperature of the membrane and temporary support; and
    removing the temporary support after the step of bonding the membrane to a base substrate, the base substrate having a thermal expansion coefficient similar to that of the membrane.

8. A method, as set forth in claim 1, wherein the step of straining the membrane along at least one axis includes the step of coupling a set of clamps to opposite sides of the membrane and applying forces to the membrane in opposite directions through the clamps.

9. A method, as set forth in claim 4, wherein the base substrate has a curvature.

10. A method, as set forth in claim 4, wherein the step of straining the membrane includes the step of producing uniform strain within the membrane through a series of rollers.

11. A method, as set forth in claim 1, wherein the step of straining the membrane includes the step of positioning a crystalline sheet within a curvature of a support structure and wherein the membrane is bonded to the sheet while the sheet and membrane are in the support structure.

12. A method, as set forth in claim 11, including the steps of releasing the membrane and sheet from the support structure and bonding to a base substrate.

13. A method, as set forth in claim 1, wherein the base substrate is composed of a rigid material.

14. A method, as set forth in claim 1, wherein the strained crystalline microelectronic device is an integrated circuit.

15. A method, as set forth in claim 1, wherein the strained crystalline microelectronic device is a laser within a n indirect semiconductor.

16. A method, as set forth in claim 1, wherein the strained crystalline microelectronic device is photosensitive.

17. A method, as set forth in claim 1, wherein the strained crystalline microelectronic device is radiation emitting.

18. A method for producing a strained crystalline microelectronic device, including the steps of:
    producing a microelectronic device in the form of a membrane;

applying a tensile strain to the membrane along at least one axis; and, bonding the membrane to a base substrate.

19. A method, as set forth in claim 18, wherein the step of a producing a microelectronic device on a membrane includes the steps of:

producing the microelectronic device within a wafer; and, reducing a thickness of the wafer.

20. A method, as set forth in claim 18, wherein the step of straining the membrane includes the step of mechanically straining the membrane uni-axially.

21. A method, as set forth in claim 18, wherein the step of straining the membrane along at least one axis includes the step of mechanically straining the membrane bi-axially.

22. A method, as set forth in claim 18, wherein the step of straining the membrane along at least one axis includes the step of coupling a set of clamps to opposite sides of the membrane and applying forces to the membrane in opposite directions through the clamps.

23. A method, as set forth in claim 20, wherein the step of straining the membrane includes the step of mounting the membrane over a curved structure.

24. A method, as set forth in claim 20, wherein the step of straining the membrane includes the step of producing uniform strain within the membrane through a series of rollers.

25. A method, as set forth in claim 21, including the following steps before the step of bonding the membrane to a base substrate:

bonding the membrane to a temporary support at a low temperature, the temporary support having a higher thermal expansion coefficient than the membrane; and, raising the temperature of the membrane and temporary support; and removing the temporary support after the step of bonding the membrane to a base substrate, the base substrate having a thermal expansion coefficient similar to that of the membrane.

26. A method, as set forth in claim 21, including the following steps before the step of bonding the membrane to a base substrate:

bonding the membrane to a temporary support at a first temperature, the temporary support having a lower thermal expansion coefficient than the membrane;

lowering the temperature of the membrane and temporary support; and removing the temporary support after the step of bonding the membrane to a base substrate, the base substrate having a thermal expansion coefficient similar to that of the membrane.

27. A method of producing strained crystalline microelectronic device chips, including the steps of:

producing a membrane, a plurality of crystalline microelectronic device chips being integrally formed therein;

applying a tensile strain to the membrane along at least one axis;

mounting the membrane on a base substrate; and dicing the membrane to separate the strained crystalline microelectronic device chips.

28. A method of producing a strained crystalline microelectronic device, including the steps of:

bonding a base substrate to a first side of the membrane, a microelectronic device being formed therein;

bonding an upper substrate to a second side of the membrane; and applying sheer strain to the membrane by applying force to the base and upper substrates.

29. A method, as set forth in claim 28, wherein the step of applying sheer strain to the membrane includes the step of applying force to the base and upper substrates in opposite directions along an axis of the membrane.

30. A method, as set forth in claim 28, wherein the step of applying sheer strain to the membrane includes the step of rotating the base and upper substrates in opposite directions.

* * * * *